(12) United States Patent
Oyama

(10) Patent No.: US 8,674,756 B2
(45) Date of Patent: Mar. 18, 2014

(54) POWER CUT-OFF TECHNIQUE FOR SEMICONDUCTOR DEVICE

(75) Inventor: Masaaki Oyama, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/538,052

(22) Filed: Jun. 29, 2012

(65) Prior Publication Data

US 2013/0002337 A1     Jan. 3, 2013

(30) Foreign Application Priority Data

Jul. 1, 2011   (JP) ................................. 2011-147132

(51) Int. Cl.
    *H01L 25/00*   (2006.01)
(52) U.S. Cl.
    USPC ......................................................... 327/564
(58) Field of Classification Search
    USPC ................................................. 327/564–566
    See application file for complete search history.

(56) References Cited

U.S. PATENT DOCUMENTS

| | | | | |
|---|---|---|---|---|
| 4,070,667 A | * | 1/1978 | Eichelberger | 341/136 |
| 4,109,161 A | * | 8/1978 | Iijima | 307/87 |
| 5,212,442 A | * | 5/1993 | O'Toole et al. | 324/73.1 |
| 7,167,991 B2 | * | 1/2007 | Higashida | 713/320 |
| 7,214,622 B2 | | 5/2007 | Sugiyama et al. | |
| 7,974,055 B2 | * | 7/2011 | Lin | 361/56 |
| 8,552,569 B2 | * | 10/2013 | Lee | 257/777 |
| 2010/0219800 A1 | | 9/2010 | Fukuoka et al. | |
| 2013/0009278 A1 | * | 1/2013 | Lee | 257/530 |

FOREIGN PATENT DOCUMENTS

| | | |
|---|---|---|
| JP | 2006-049477 A | 2/2006 |
| JP | 2009-200690 A | 9/2009 |
| JP | 2010-226083 A | 10/2010 |

* cited by examiner

*Primary Examiner* — William Hernandez
(74) *Attorney, Agent, or Firm* — Sughrue Mion, PLLC

(57) ABSTRACT

Disclosed here is a semiconductor integrated circuit device configured to suppress a voltage drop over the route for transmitting voltages from a power cut-off switch to a power cut-off region without lowering the degree of freedom in routing signal wires in that region. The semiconductor integrated circuit device includes a semiconductor chip in which the power cut-off switch and power cut-off region are provided. A reduction in the number of wiring channels in the power-cut off region is avoided by locating the power cut-off switch outside the power cut-off region. Over the substrate, a substrate-side feed line is formed to transmit a power-supply voltage from the semiconductor chip to outside thereof via the power cut-off switch, before introducing the voltage again into the chip to feed the power cut-off region, thus suppressing the voltage drop between the power cut-off switch and the power cut-off region.

6 Claims, 10 Drawing Sheets

POWER CUT-OFF TECHNIQUE FOR SEMICONDUCTOR DEVICE

CROSS-REFERENCE TO RELATED APPLICATIONS

The disclosure of Japanese Patent Application No. 2011-147132 filed on Jul. 1, 2011 including the specification, drawings and abstract is incorporated herein by reference in its entirety.

BACKGROUND

The present invention relates to a semiconductor integrated circuit device. More particularly, the invention relates to a power supply technology for supplying power to that region (the power cut-off region) of such a semiconductor integrated circuit device to which the supply of power is cut off as needed.

As described in Japanese Unexamined Patent Publication No. 2006-49477 (Patent Literature 1 hereunder), there exist semiconductor integrated circuit devices each having a semiconductor chip joined by flip-chip bonding to a wiring substrate (package substrate).

A power cut-off technique is one of the power-saving techniques applicable to the semiconductor integrated circuit device. The power cut-off technique involves dividing the interior of the semiconductor integrated circuit device into a plurality of circuit blocks so that the power to any inactive circuit block may be cut off, thereby suppressing leak currents that contribute to power dissipation. Japanese Unexamined Patent Publication No. 2010-226083 (Patent Literature 2 hereunder) and Japanese Unexamined Patent Publication No. 2009-200690 (Patent Literature 3 hereunder), among others, describe the power cut-ff technique. The technique disclosed in Patent Literature 2 involves allowing a power cut-off technique utilizing a power cut-off switch arrangement and a power-saving technique based on DVFS (Dynamic Voltage Frequency Scaling) to coexist so as to reduce power dissipation efficiently. Patent Literature 3 proposes a method for designing a semiconductor integrated circuit with a minimum of through-current countermeasures taken while aiming at reducing power dissipation.

SUMMARY

To cut off power to an inactive circuit block, the power cut-off technique uses a power cut-off switch installed halfway over power-supply wiring between the power-supply terminal of the semiconductor integrated circuit device and its power cut-off region. Turning off the power cut-off switch removes the supply of power to the power cut-off region. After examining this kind of power cut-off technique, the inventors of this application found the following problem:

In order to suppress the voltage drop caused by the resistance of the wiring for supplying power to the power cut-off region, it has been preferred to install a plurality of power cut-off switches in the power cut-off region, with a power-supply voltage fed to the switches via bump electrodes installed nearby. However, installing the multiple power cut-off switches in the power cut-off region entails having wiring channels appropriated by the power-supply and signal wiring coupled to these switches. This results in a reduced number of wiring channels inside the power cut-off region. The reduced wiring channel count can lower the degree of freedom in installing logical block signal wires inside the power cut-off region, thereby worsening routability.

The present invention has been made in view of the above circumstances and provides a technique for suppressing the voltage drop over voltage transmission routes between the power cut-off switches and the power cut-off region without reducing the degree of freedom in routing the signal wiring in the power cut-off region.

Further objects and advantages of the present invention will become apparent upon a reading of the following description and appended drawings.

The following is a brief description of the outline of a representative aspect of the invention disclosed in the present application.

In carrying out the present invention and according to one aspect thereof, there is provided a semiconductor integrated circuit device including a semiconductor chip configured to have a power cut-off switch and a power cut-off region to which the supply of power may be cut off by the power cut-off switch, and a substrate configured to have the semiconductor chip joined thereto. The power cut-off switch is located outside the power cut-off region. The substrate has a substrate-side feed line configured to let a power-supply voltage transmitted out of the semiconductor chip through the power cut-off switch be transmitted back into the semiconductor chip to power the power cut-off region.

The following is a brief description of an effect obtained according to the representative aspect of the invention disclosed in the present application.

The semiconductor integrated circuit device of the present invention embodied as outlined above makes it possible to suppress the voltage drop over the voltage transmission route between the power cut-off switch and the power cut-off region without reducing the degree of freedom in routing the signal wiring of the power cut-off region.

DETAILED DESCRIPTION

1. Outline of the Embodiments

Figure 1:
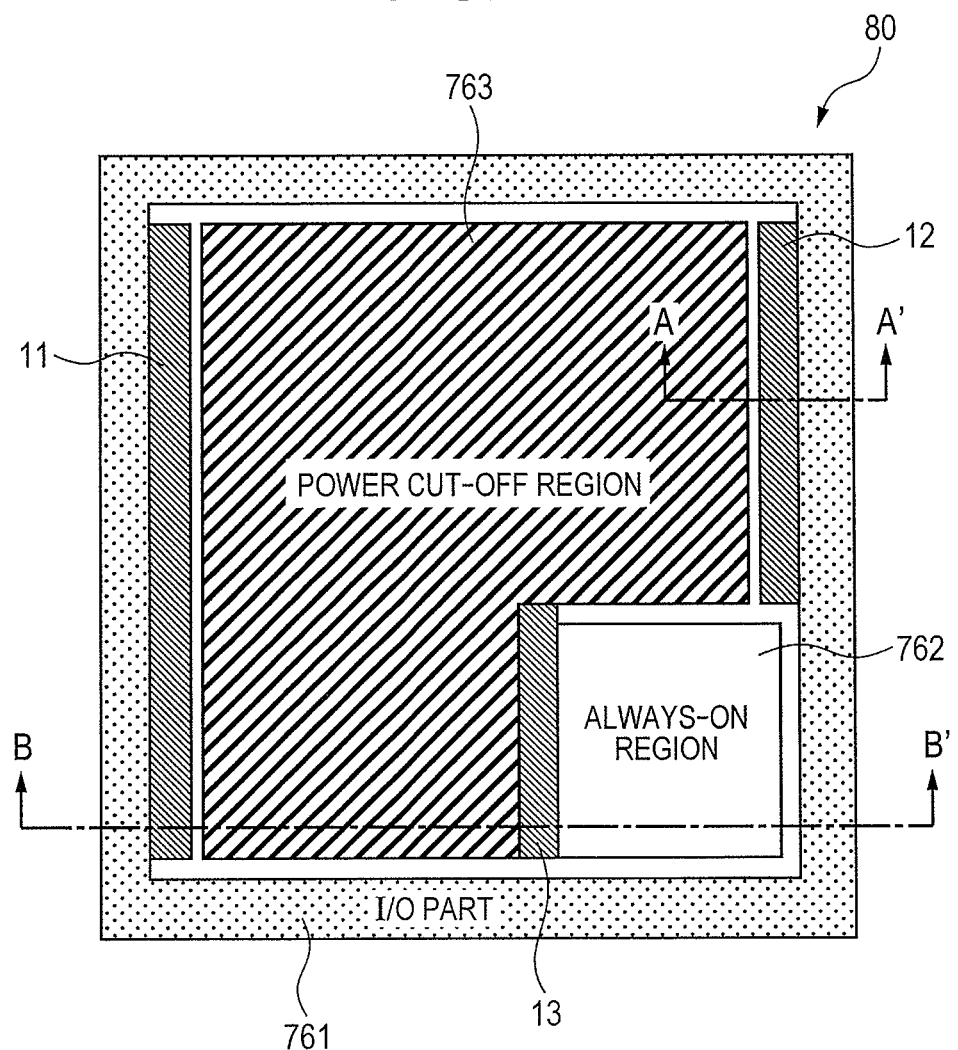
FIG. 1 is a plan view of a semiconductor integrated circuit device according to the present invention.

A representative preferred embodiment of the present invention will be first outlined below. The reference characters used in the accompanying drawings and parenthesized in the ensuing description simply point to what is conceptually included in each of the indicated components of the representative embodiment.

[1] A semiconductor integrated circuit device (80) practiced as the representative embodiment of the present invention includes a semiconductor chip (22) configured to have a power cut-off switch (90) and a power cut-off region (763) to which the supply of power may be cut off by the power cut-off switch. The semiconductor chip is joined to a substrate (21). The power cut-off switch is located outside the power cut-off region. The substrate has a substrate-side feed line (30) configured to let a power-supply voltage transmitted out of the semiconductor chip through the power cut-off switch from inside of the semiconductor chip be transmitted back into the semiconductor chip to power the power cut-off region. Because the power cut-off switch is positioned outside the power cut-off region, the number of wiring channels inside the power cut-off region is not reduced by the presence of the power-supply and signal wires coupled to the power cut-off switch. Since the substrate is subject to less stringent wiring constraints than the semiconductor chip, the wiring over the substrate can have a larger cross-sectional area than the power-supply wiring inside the chip. The larger the cross-sectional area of wiring, the smaller the resistance of that wiring becomes. Thus when the substrate-side feed line is used to let the power-supply voltage transmitted out of the semiconductor chip through the power cut-off switch be transmitted back into the semiconductor chip to power the power cut-off region, it is possible to suppress the voltage drop between the power cut-off switch and the power cut-off region.

[2] In the semiconductor integrated circuit device described in the preceding paragraph [1], the substrate-side feed line may be configured to let either a high-potential power-supply voltage (VDD) or a low-potential power-supply voltage (VSS) transmitted out of the semiconductor chip through the power cut-off switch be transmitted back into the semiconductor chip.

[3] In the semiconductor integrated circuit device described in the preceding paragraph [2], the semiconductor chip may be joined to the substrate through bump electrodes (23 through 26) installed in the semiconductor chip.

[4] In the semiconductor integrated circuit device described in the preceding paragraph [3], the semiconductor chip may have power-supply wires (32, 33, 34) configured to transmit the power-supply voltage to the power cut-off region through the power cut-off switch. In this case, the substrate-side feed line may be coupled in parallel to the power-supply wires. This configuration allows the combined resistance value of the substrate-side feed line coupled in parallel with the power-supply wires to be smaller than the resistance value of the substrate-side feed line or that of the power-supply wires. This can effectively suppress the voltage drop between the power cut-off switch and the power cut-off region.

[5] In the semiconductor integrated circuit device described in the preceding paragraph [4], the substrate may be configured to have a heat dissipation ball (29) for dissipating heat of the substrate-side feed line. If a large current is consumed in the power cut-off region, the heating value over the substrate-side feed line can also be high. This lends importance to the dissipation of heat via the heat dissipation ball.

[6] In the semiconductor integrated circuit device described in the preceding paragraph [5], there may be provided a power-supply control circuit (85) configured to cut off the supply of power to the power cut-off region by turning off the power cut-off switch when the circuits belonging to the power cut-off region are inactive.

2. Detailed Description of the Embodiments

Some preferred embodiments of the present invention are explained below in more detail.

First Embodiment

Figure 7:
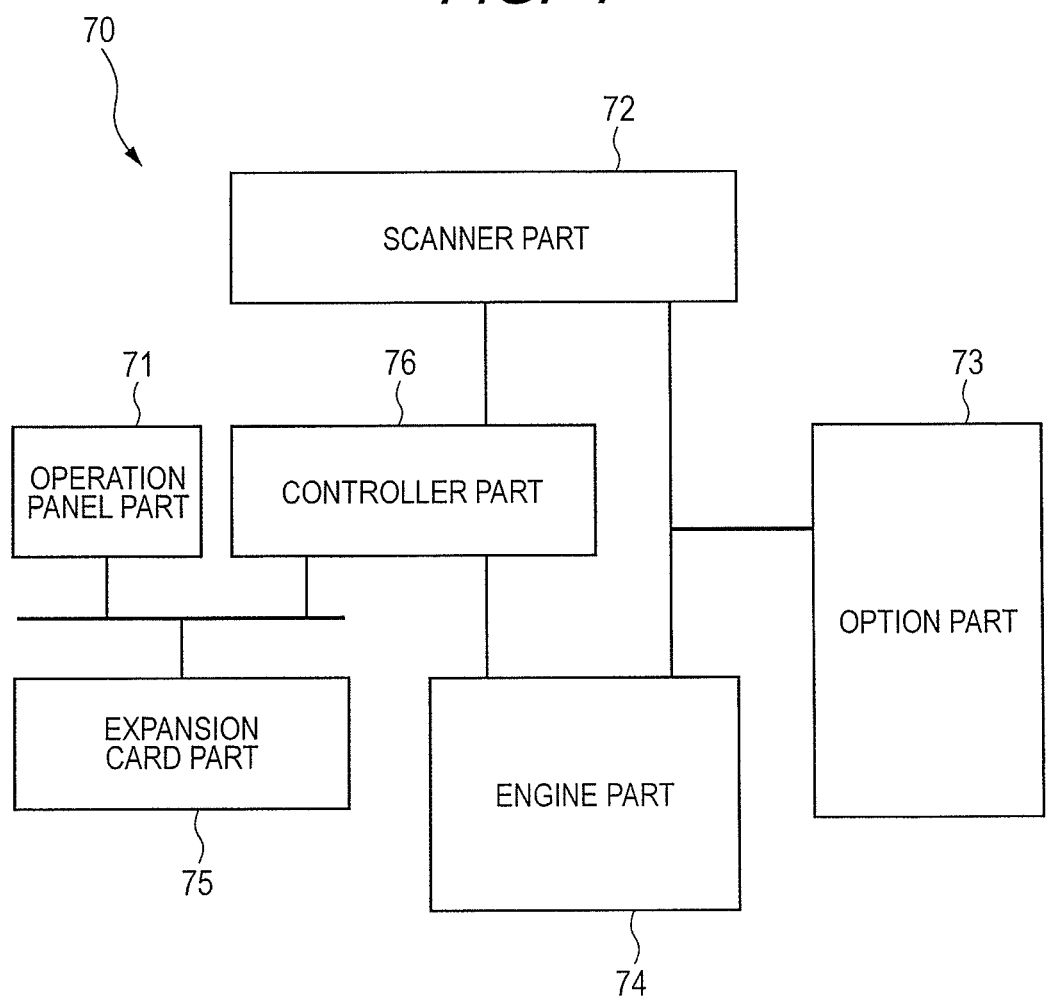
FIG. 7 is a schematic block diagram of a plain paper copier to which the semiconductor integrated circuit device shown in FIG. 1 is applied.

FIG. 7 schematically shows a typical configuration of a plain paper copier 70 to which the semiconductor integrated circuit device of the present invention is applied.

The plain paper copier 70 in FIG. 7 is configured to include an operation panel part 71, a scanner part 72, an option part 73, an engine part 74, an expansion card part 75, and a controller part 76. The operation part 71 is provided to make various settings of the plain paper copier 70. The scanner part 72 reads information by scanning through sensors. The option part 73 is used by the user to selectively set up additional functions or otherwise enhance the performance of the copier. The engine part 74 performs a copying process on the information read by the scanner part 72. The expansion card part 75 is provided to accommodate an expansion card to be coupled to a network or to a telephone line. The controller part 76 provides overall operation control of the plain paper copier 70. The controller part 76 is configured with a semiconductor integrated circuit device such as an SoC (System-on-a-chip). This type of semiconductor integrated circuit device adopts a power cut-off technique whereby the device interior is divided into a plurality of circuit blocks so that the supply of power to any inactive circuit block can be cut off to suppress leak currents leading to power dissipation.

Figure 8:
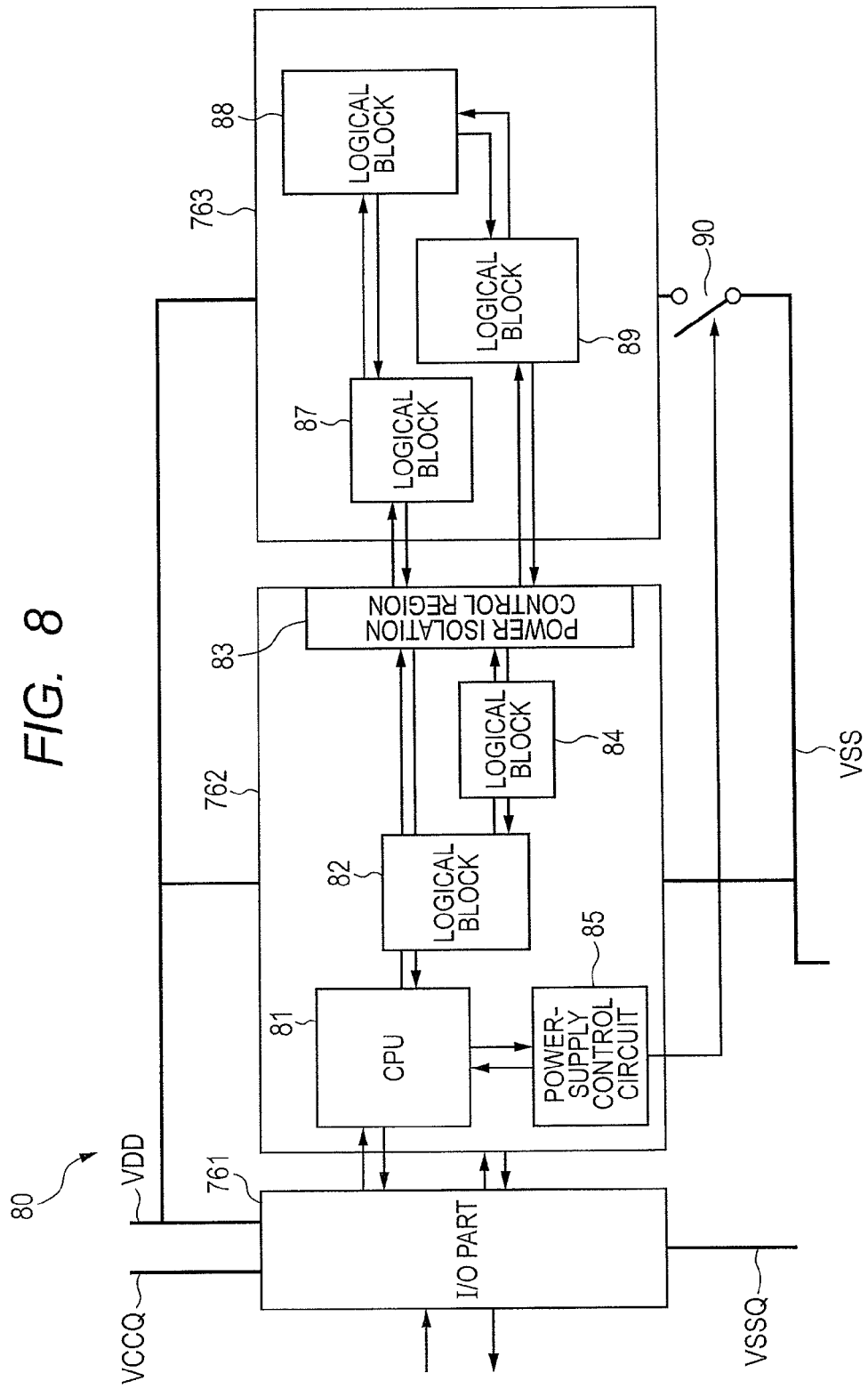
FIG. 8 is a schematic block diagram of the semiconductor integrated circuit device shown in FIG. 1.

FIG. 8 shows a configuration example of a semiconductor integrated circuit device 80 applied to the controller part 76 mentioned above. The semiconductor integrated circuit device 80 includes always-on regions 761 and 762 and a power cut-off region 763. Using known semiconductor integrated circuit manufacturing technology, these areas are formed over a single semiconductor substrate such as a single-crystal silicon substrate. With a main power cut-off switch of the plain paper copier 70 turned on, the I/O part 761 is continuously supplied with a low-potential power-supply voltage VSSQ and a high-potential power-supply voltage VCCQ. Also with the main power cut-off switch of the plain paper copier 70 turned on, the always-on region 762 is continuously supplied with a low-potential power-supply voltage VSS and a high-potential power-supply voltage VDD. The power cut-off region 763 is fed with the high-potential power-supply voltage VDD. However, the power cut-off region 763 is also coupled to a line of the low-potential power-supply voltage VSS via a power cut-off switch 90. With the power cut-off switch 90 turned on, the low-potential power-supply voltage VSS is fed to the power cut-off region 763. The always-on region 762 includes a CPU (central processing unit) or a control logic circuit 81, logical blocks 82 and 84, a power isolation control region 83, and a power-supply control circuit 85. The CPU 81 performs predetermined operations in accordance with preinstalled programs. The logical blocks 82 and 84 carry out logical operations on an input signal. The power isolation control region 83 is provided to prevent the signal lines coupling deactivated circuits with active circuits from exerting electrically detrimental effects on the circuits involved. When the power cut-off region 763 is inactive, the power-supply control circuit 85 under control of the CPU 81 turns off the power cut-off switch 90 to suppress leak currents of the power cut-off region 763. The power cut-off region 763 includes logical blocks 87, 88 and 89 that carry out logical operations on the input signal.

FIG. 1 shows a typical layout of the semiconductor integrated circuit device 80 mentioned above.

The I/O part 761 is located in the chip periphery of the semiconductor integrated circuit device 80. The always-on region 762 and power cut-off region 763 are positioned in a manner surrounded by the I/O part 761. Also, outside the power cut-off region 763, power cut-off switch forming regions 11, 12 and 13 are provided in a manner flanking the power cut-off region 763. The power cut-off switch 90 is formed in the power cut-off switch forming regions 11, 12 and 13.

Figure 2:
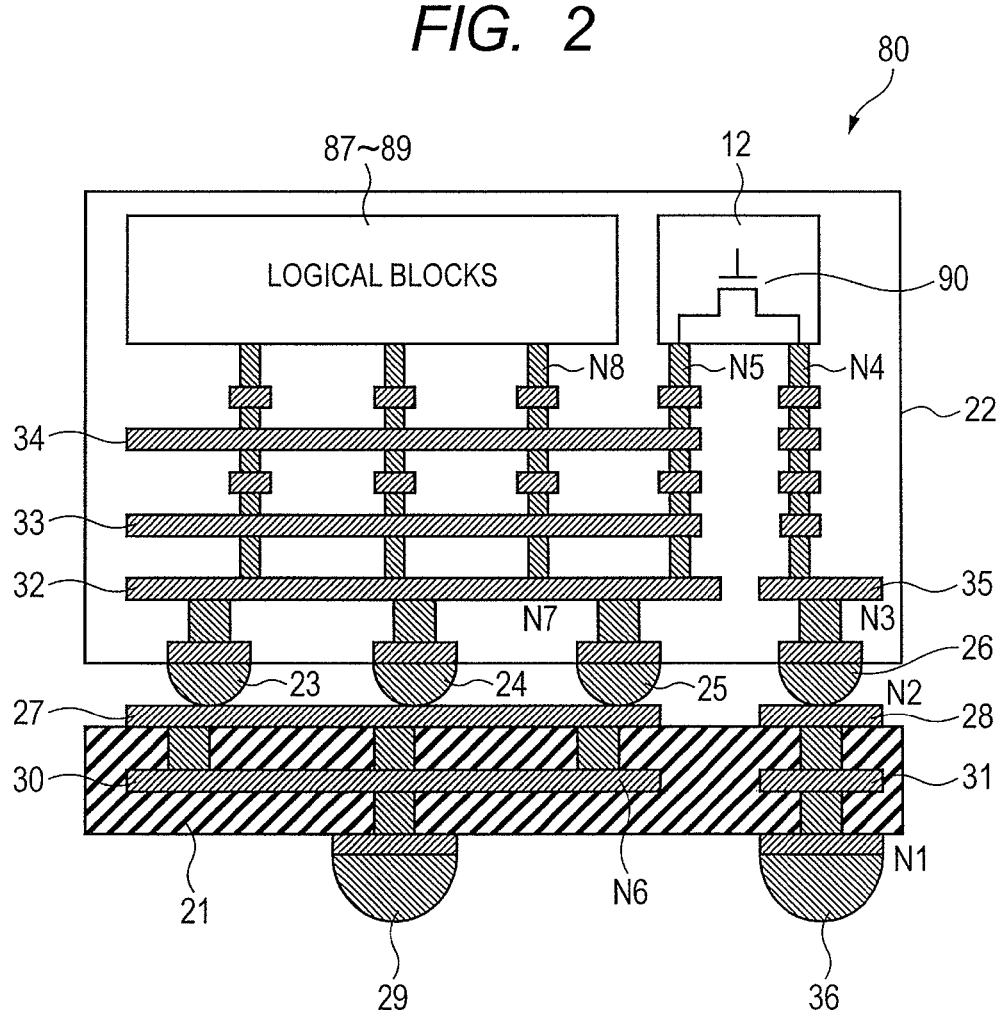
FIG. 2 is a cross-sectional view taken on line A-A' of FIG. 1.

FIG. 2 is a cross-sectional view taken on line A-A' of FIG. 1.

In the semiconductor integrated circuit device 80, a semiconductor chip 22 is attached by flip-chip bonding to the top of a package substrate 21. That is, bump electrodes 23, 24, and 26 of the semiconductor chip 22 are electrically coupled to top pads 27 and 28 of the package substrate 21, and the junctions between the bump electrodes 23, 24, 25 and 26 on the one hand and the pads 27 and 28 of the package substrate 21 on the other hand are sealed by underfill resin. The back of the package substrate 21 is furnished with solder balls 29 and 36 for joining the semiconductor integrated circuit device 80 to the board of the controller part 76.

In the semiconductor chip 22, power-supply wires 32, 33, 34 and 35 are formed to supply the low-potential power-supply voltage VSS to the logical blocks 87 through 89 inside the power cut-off region 763. The power-supply wires 32, 33 and 34 are coupled via through-holes to the logical blocks 87 through 89 inside the power cut-off region 763 and to the power cut-off switch 90 inside the power cut-off switch forming region 12. The power-supply wire 35 is coupled via a through-hole to the power cut-off switch 90. The power cut-off switch 90 may be formed using an n-channel type MOS transistor. One of the terminals of the power cut-off switch 90 is coupled via through-holes to the power-supply wires 32, 33 and 34 as well as to the bump electrodes 23, 24 and 25. The other terminal of the power cut-off switch 90 is coupled via through-holes to the power-supply wire 35 and bump electrode 26.

Power-supply planes 30 and 31 are formed within the package substrate 21. Also, pads 27 and 28 are formed over the top of the package substrate 21. A solder ball 29 is coupled via a through-hole to the power-supply plane 30, and the solder ball 36 is coupled via a through-hole to the power-supply plane 31. The bump electrodes 23, 24 and 25 of the semiconductor chip 22 are coupled to the top pad 27 of the package substrate 21. A solder ball 36 of the package substrate 21 serves as an input terminal for the low-potential power-supply voltage VSS. The solder ball 36 is coupled to the low-potential power-supply voltage VSS of a component mounting board of the plain paper copier 70. The solder ball 29 serves as a heat dissipation ball for discharging the heat of the power-supply plane 31 to outside of the substrate, and is not used for supplying power. Here, the package substrate 21 is subject to less stringent constraints on wiring than the above-mentioned semiconductor chip 22. This makes it possible to form wiring with a larger cross-sectional area (i.e., power-supply plane 30) in the substrate than the power-supply wiring inside the chip.

Figure 3:
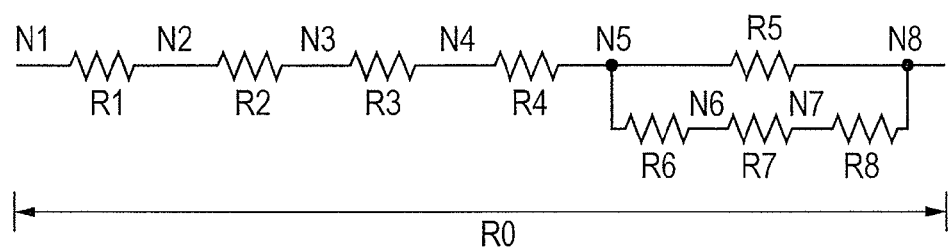
FIG. 3 is a schematic view showing an equivalent circuit of major parts in FIG. 2.

In the above configuration, the power-supply plane 30 in the package substrate 21 is coupled in parallel to the power-supply wires 32, 33 and 34 in the semiconductor chip 22. It is assumed here that reference character N1 stands for the location where the solder ball 36 is formed, N2 for the location where the pad 28 is formed, N3 for the location where the power-supply wire 35 is formed, N4 and N5 for the two terminals of the power cut-off switch 90, N6 for the location where the power-supply plane 30 is formed, N7 for the location where the power-supply wire 32 is formed, and N8 for a low-potential power-supply voltage input part of the logical blocks 87 through 89. On these assumptions, an equivalent circuit of the route from N1 to N8 is provided as shown in FIG. 3. That is, a substrate resistance R1 between N1 and N2, a bump electrode resistance R2 between N2 and N3, an intra-chip wiring resistance R3 between N3 and N4, a power cut-off switch resistance R4 between N4 and N5, and an intra-chip wiring resistance R5 between N5 and N8 are serially coupled to one another. Also, a substrate resistance R6 between N5 and N6, a bump electrode resistance R7 between N6 and N7, and an intra-chip wiring resistance R8 between N7 and N8 are serially coupled to one another. The serially coupled resistances (R6, R7 and R8) are coupled in parallel to the intra-chip wiring resistance R5 between N5 and N8. Thus a combined resistance R0 between N1 and N8 becomes smaller than if the power-supply plane 30 in the package substrate 21 is not coupled in parallel to the power-supply wires 32, 33 and 34 in the semiconductor chip 22.

Although the transmission route of the high-potential power-supply voltage VDD is not shown in FIG. 2, the high-potential power-supply voltage VDD is supplied to the semiconductor chip 22 via a high-potential power-supply voltage transmission route, not shown.

Figure 4:
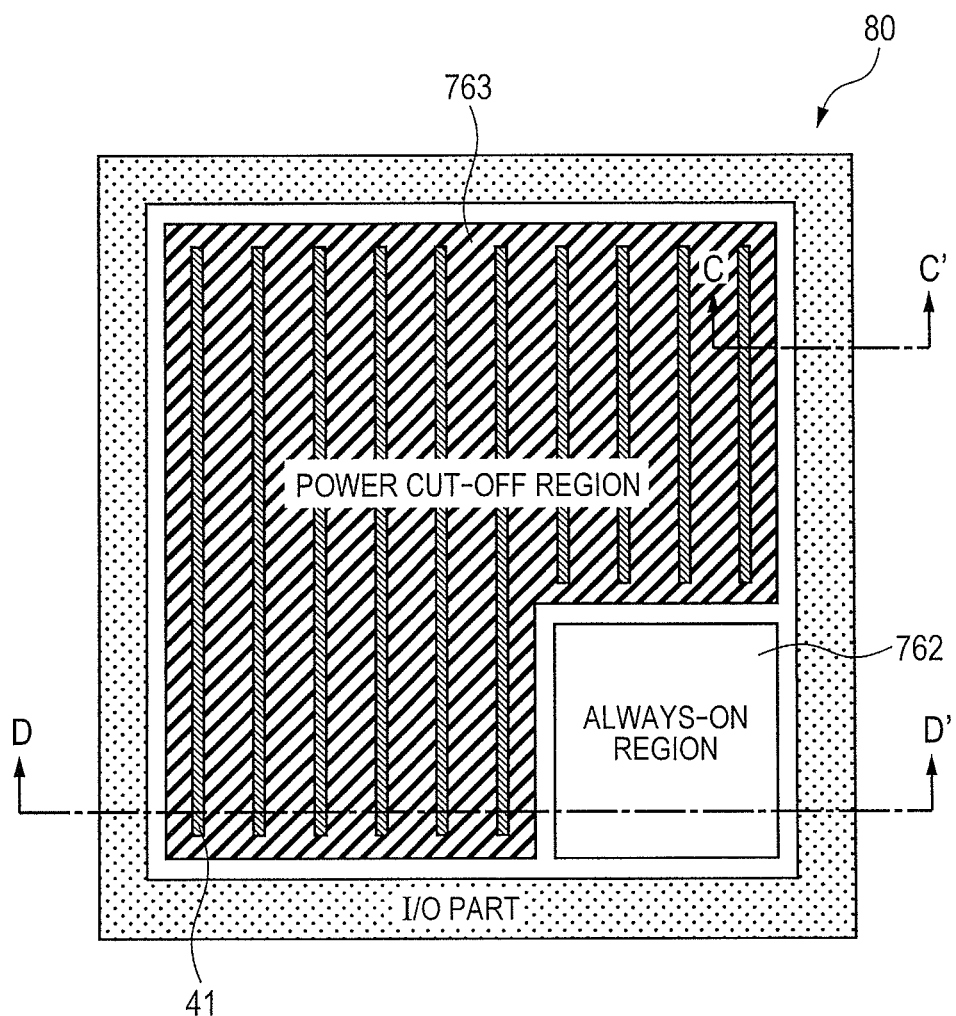
FIG. 4 is a plan view of a semiconductor integrated circuit device used for the purpose of comparison with the semiconductor integrated circuit device shown in FIG. 1.
Figure 5:
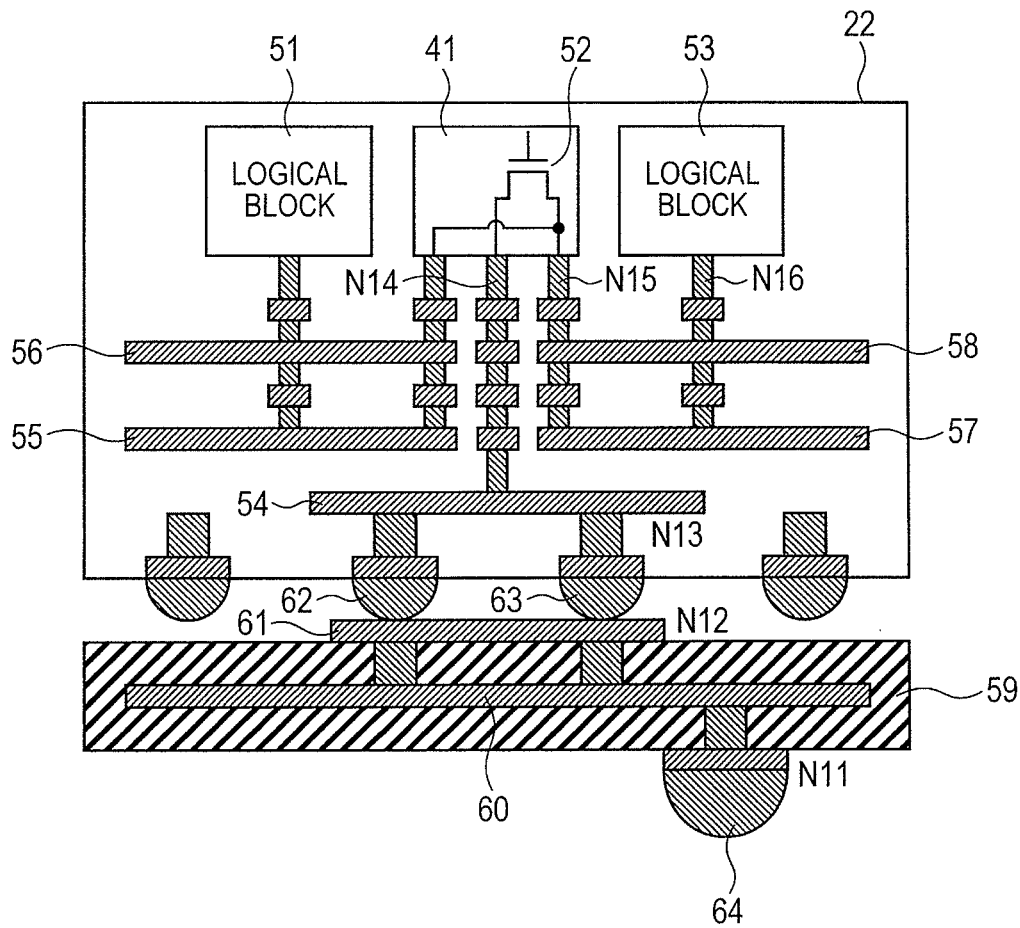
FIG. 5 is a cross-sectional view taken on line C-C' of FIG. 4.
Figure 6:
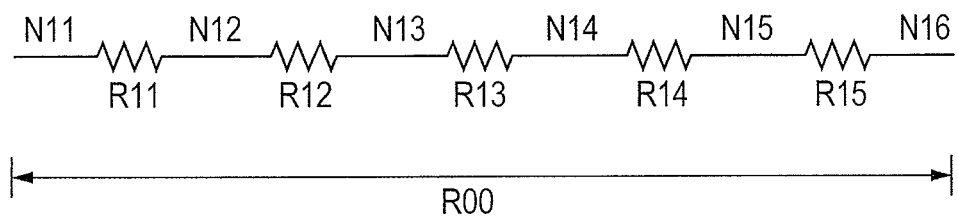
FIG. 6 is a schematic view showing an equivalent circuit of major parts in FIG. 5.

FIG. 4 shows a typical layout for the purpose of comparison with the layout example illustrated in FIG. 1. In the layout example of FIG. 4, numerous power cut-off switch forming regions 41 are arrayed at predetermined intervals in the power cut-off region 763. FIG. 5 is a cross-sectional view taken on line C-C' of FIG. 4. The semiconductor chip 22 is attached by flip-chip bonding to the top of a package substrate 59. The low-potential power-supply voltage VSS is supplied to a solder ball 58 of the package substrate 59. The low-potential power-supply voltage VSS is transmitted to the pad 27 via a power-supply plane 60 in the package substrate 59. The power cut-off switch forming regions 41 are formed between logical blocks 51 and 53 furnished in the power cut-off region 763. The low-potential power-supply voltage VSS is transmitted to a power-supply wire 54 via bump electrodes 62 and 63 immediately under a power cut-off switch (n-channel type MOS transistor) 52 furnished in the power cut-off switch forming regions 41. Furthermore, the low-potential power-supply voltage VSS is transmitted to the logical blocks 51 and 53 via the power cut-off switch 52 and power-supply wires 55, 56, 57 and 58. In the typical layout of FIG. 4, the low-potential power-supply voltage VSS may be brought in as explained above via the bump electrodes 62 and 63 immediately under the power cut-off switch 52. However, the low-potential power-supply voltage transmission route from the power cut-off switch 52 to the logical blocks 51 and 53 is formed only by the power-supply wires 55, 56, 57 and 58 inside the semiconductor chip 22; no use is made of the power-supply plane inside the package substrate 59. It is assumed here that reference character N11 stands for the location where a solder ball 64 is formed, N12 for the location where a pad 61 is formed, N13 for the location where the power-supply wire 54 is formed, N14 and N15 for the two terminals of the power cut-off switch 52, and N16 for a low-potential power-supply voltage input part of the logical block 53. On these assumptions, an equivalent circuit of the route from N11 to N16 is provided as shown in FIG. 6. That is, a substrate resistance R11 between N11 and N12, a bump electrode resistance R12 between N12 and N13, an intra-chip wiring resistance R13 between N13 and N14, a power cut-off switch resistance R14 between N14 and N15, and an intra-chip wiring resistance R15 between N15 and N16 are serially coupled to one another.

As shown in FIG. 4, where numerous power cut-off switch forming regions 41 are arrayed at predetermined intervals in the power cut-off region 763, the power-supply wires between the power cut-off switch 51 and the logical block 51 or 53 are relatively short. That means the value of the combined resistance R00 of the resistances R11 through R15 is not significantly high.

However, as shown in FIG. 4, where the many power cut-off switch forming regions 41 are furnished at predetermined intervals in the power cut-off region 763, the presence of the power-supply wires and of the signal wires for transmitting control signals of the power cut-off switches reduces the number of wiring channels inside the power cut-off region 763. This lowers the degree of freedom in arranging the signal wires within the power cut-off region 763 and worsens signal routability. If the power cut-off switch forming regions 11, 12 and 13 are provided outside the power cut-off region 763 in a manner surrounding that region, as shown in FIG. 1 for example, the number of wiring channels in the power cut-off region 763 is not reduced as opposed to the setup in FIG. 4. However, since the power-supply wires between the power cut-off switch 52 and the logical block 51 or 53 are prolonged in this case, the combined resistance R00 of the resistances R11 through R15 is raised and the voltage drop involved is not negligible.

On the other hand, when the power-supply plane 30 in the package substrate 21 is coupled in parallel to the power-supply wires 32, 33 and 34 in the semiconductor chip 22 as shown in FIG. 2, the combined resistance R9 between N1 and N8 can be reduced. This makes it possible to supply appropriate power-supply voltages to the logical blocks 87 through 89.

When the solder ball 29 is used as a heat dissipation ball for discharging the heat of the power-supply plane 31 to outside of the substrate, the temperature of the power-supply wires 32, 33 and 34 and that of the power-supply plane 30 are prevented from getting inordinately raised. This effect of heat dissipation is particularly pronounced with the SoC used as the controller part 76 whose consumption current is large.

Second Embodiment

Figure 9:
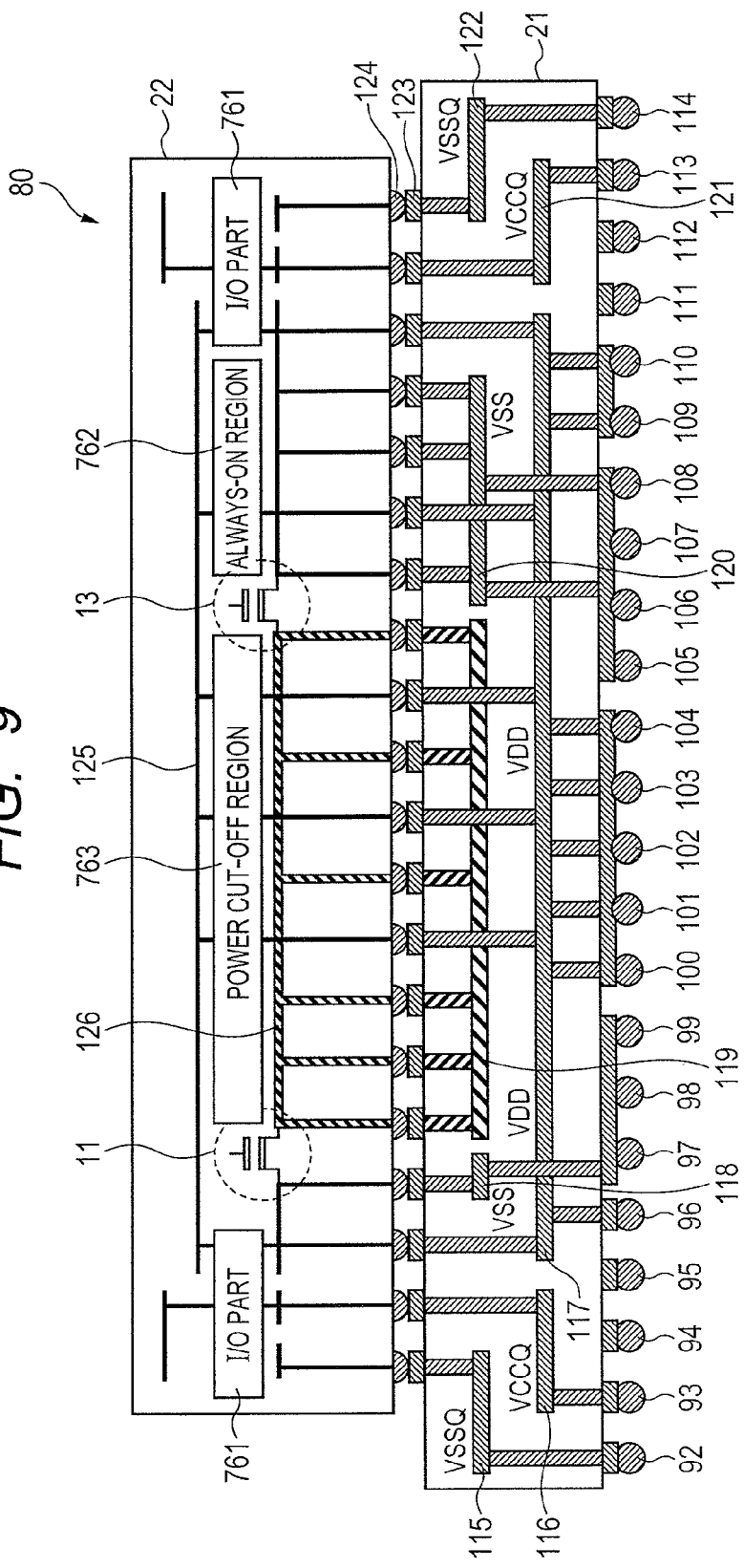
FIG. 9 is a cross-sectional view taken on line B-B' of FIG. 1.

FIG. 9 is a cross-sectional view taken on line B-B' of FIG. 1.

In the semiconductor integrated circuit device 80, the semiconductor chip 22 is attached by flip-chip bonding to the top of the package substrate 21. A plurality of bump electrodes 124 of the semiconductor chip 22 are electrically coupled to corresponding top pads 123 of the package substrate 21. The junctions between the bump electrodes 124 of the semiconductor chip 22 and pads 122 of the package substrate 21 are sealed by underfill resin. The back of the package substrate 21 is furnished with solder balls 92 through 114.

The low-potential power-supply voltage VSSQ is transmitted to the I/O part 761 via the solder balls 92 and 114 and power-supply planes 115 and 122. The high-potential power-supply voltage VDD is transmitted to the I/O part 761 via the solder balls 93 and 113 and power-supply planes 116 and 113. The high-potential power-supply voltage VDD is transmitted to the power cut-off region 763, always-on region 762, and I/O part 761 via the solder balls 96, 100 through 104, 109 and 110 and a power-supply plane 117. The low-potential power-supply voltage VSS is transmitted to the power cut-off switch forming region 13 and always-on region 762 via the solder balls 106 and 108 and a power-supply plane 120. In the semiconductor chip 22, power-supply wires 125 are provided to convey the high-potential power-supply voltage VDD. The power-supply wires 125 are coupled in parallel to the power-supply plane 117 in the package substrate 21 via through-holes so as to lower the resistance value of the route over which the high-potential power-supply voltage is transmitted. The low-potential power-supply voltage VSS is transmitted to the power cut-off switch forming region 11 via the solder balls 97 through 99 and a power-supply plane 118. Also, the low-potential power-supply voltage VSS is transmitted to the power cut-off region 763 via the power cut-off switches in the power cut-off switch forming region 11, those in the power cut-off switch forming region 13, and power-supply wires 126. Furthermore, a power-supply plane 119 in the package substrate 21 is coupled in parallel to the power-supply wires 126 in the semiconductor chip 22 via corresponding pads 123 and bump electrode 124 in order to lower the resistance value of the route over which the low-potential power-supply voltage is transmitted to the power cut-off region 763.

Figure 10:
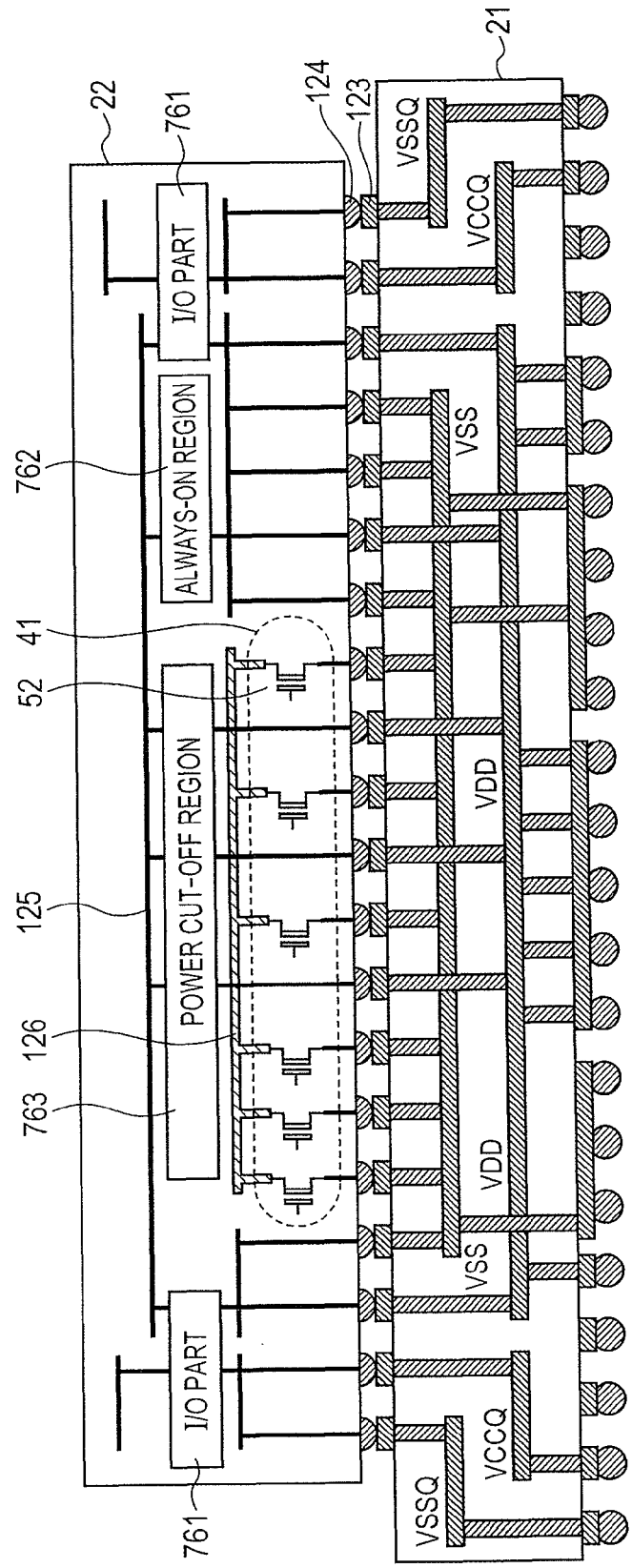
FIG. 10 is a cross-sectional view taken on line D-D' of FIG. 4.

FIG. 10 is a cross-sectional view taken on line D-D' of FIG. 4. As shown in FIG. 4, where numerous power cut-off switch forming regions 41 are arrayed at predetermined intervals in the power cut-off region 763, the low-potential power-supply voltage VSS is transmitted to the power-supply wires 126 via bump electrodes immediately under the power cut-off switch 52 formed in the power cut-off switch forming regions 41. In this case, the presence of the power-supply wires and of the wires for transmitting control signals of the power cut-off switches reduces the number of wiring channels inside the power cut-off region 763. This lowers the degree of freedom in arranging the signal wires within the power cut-off region 763 and worsens signal routability. By contrast, when the power cut-off switch forming regions 11 and 13 are provided outside the power cut-off region 763 in a manner flanking that region as shown in FIG. 9, the number of wiring channels in the power cut-off region 763 is not reduced by the presence of the power-supply wires and of the wires for transmitting control signals of the power cut-off switches inside the power cut-off region 763. That means the degree of freedom in arranging the signal wires within the power cut-off region 763 is not lowered. Also, when the power-supply plane 119 in the package substrate 21 is coupled in parallel to the power-supply wires 126 in the semiconductor chip 22 via corresponding pads 123 and bump electrode 124, the resistance value of the route over which the low-potential power-supply voltage is transmitted is lowered. This in turn prevents the power-supply voltage fed to the power cut-off region 763 from dropping inordinately.

Third Embodiment

Figure 11:
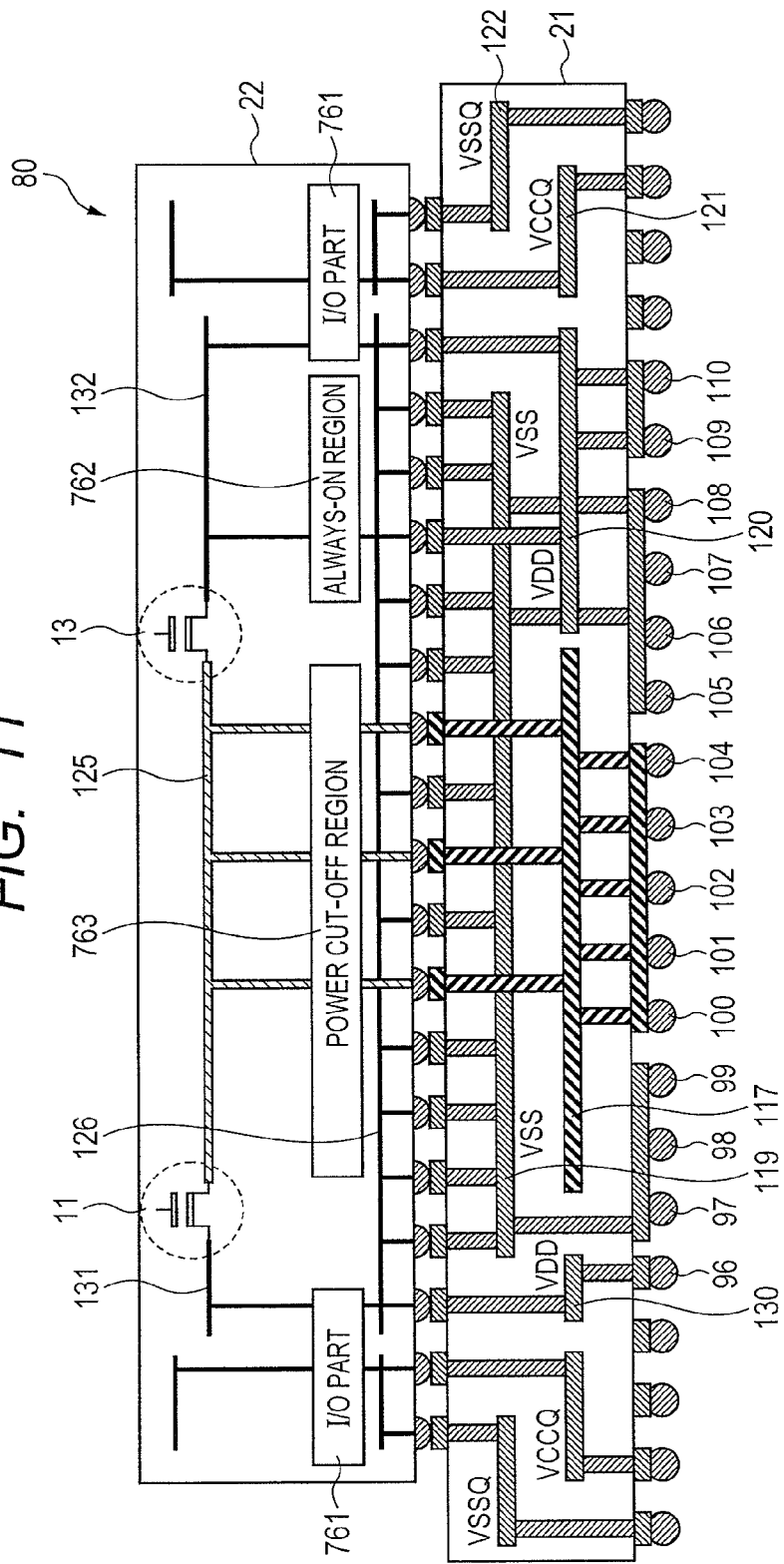
FIG. 11 is a cross-sectional view showing another configuration example of the semiconductor integrated circuit device according to the present invention.

In the first and the second embodiments discussed above, the power cut-off switch is furnished on the side of the low-potential power-supply voltage VSS among the power-supply voltages fed to the power cut-off region 763. Alternatively, the power cut-off switch may be provided on the side of the high-potential power-supply voltage VDD. FIG. 11 shows a typical configuration of the latter case. The major difference of the configuration in FIG. 11 from that in FIG. 9 is that the power cut-off switch is furnished on the side of the high-potential power-supply voltage VDD. The high-potential power-supply voltage VDD is transmitted to the power cut-off switch of the power cut-off switch forming region 11 via the solder ball 96, a power-supply plane 130, and power-supply wires 131 in the semiconductor chip 22. From the power cut-off switch and via the power-supply wires 125, the high-potential power-supply voltage VDD is transmitted to the power cut-off region 763. Also, the high-potential power-supply voltage VDD is transmitted to the power cut-off switch of the power cut-off switch forming region 11 via the solder balls 109 and 110, power-supply plane 120, and power-supply wires 132 in the semiconductor chip 22. From the power cut-off switch and via the power-supply wires 125, the high-potential power-supply voltage VDD is transmitted to the power cut-off region 763. Furthermore, the power-supply wires 125 are coupled in parallel to the power-supply plane 117 in the package substrate 21 via through-holes so as to lower the resistance value of the route over which the high-potential power-supply voltage is transmitted. The solder balls 100 through 104 coupled to the power-supply plane 117 are used as heat dissipation balls. The low-potential power-supply voltage VSS is transmitted to the always-on region 762 and power cut-off region 763 via the solder balls 97 through 99, power-supply plane 119, and power-supply wires 126 in the semiconductor chip 22.

As explained above, where the power cut-off switch is furnished on the side of the high-potential power-supply voltage VDD, the same effects as those of the second embodiment are available.

Fourth Embodiment

Figure 12:
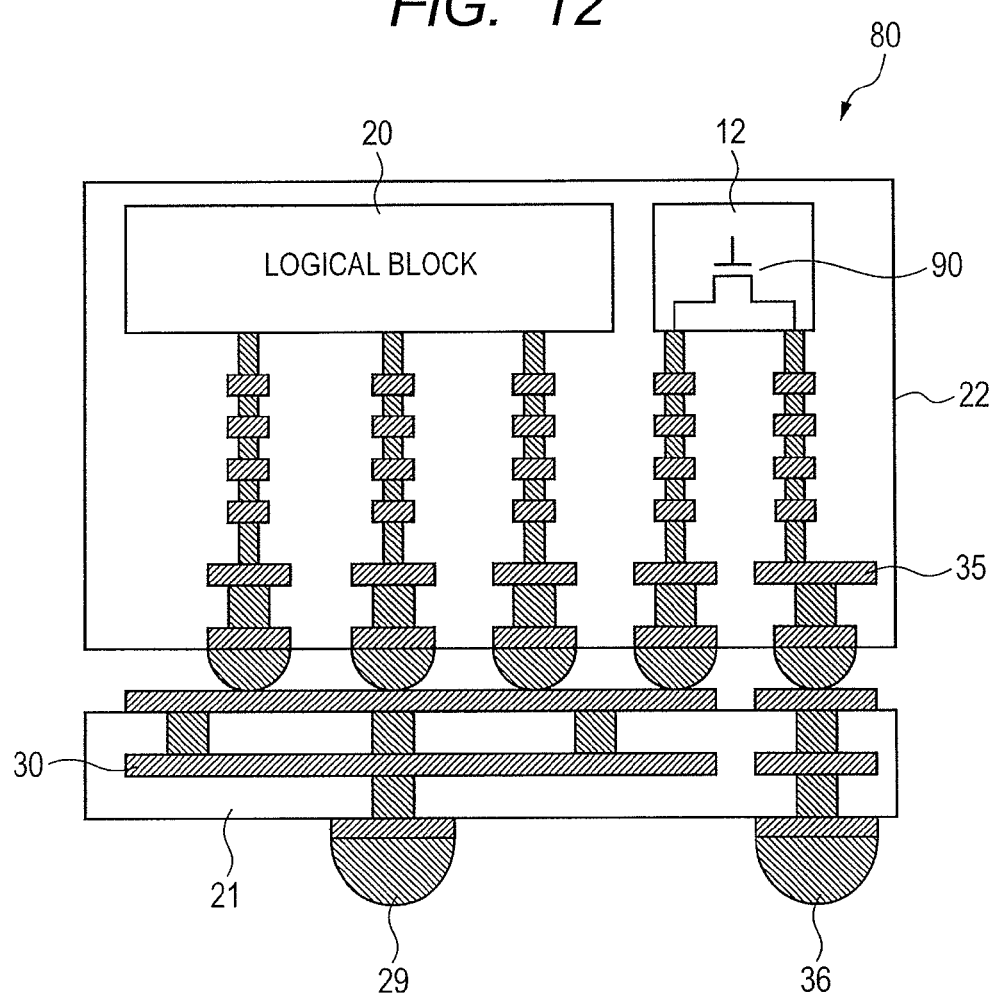
FIG. 12 is a cross-sectional view showing yet another configuration example of the semiconductor integrated circuit device according to the present invention.

FIG. 12 shows yet another configuration example of the semiconductor integrated circuit device 80.

The major difference of the semiconductor integrated circuit device 80 in FIG. 12 from that in FIG. 2 is that the power-supply wires 32, 33 and 34 in the semiconductor chip 22 are omitted. The power-supply plane 30 with its enlarged cross-sectional area in the package substrate 21 offers a resistance value lower by one or two orders of magnitude than the power-supply wires 32, 33 and 34 in the semiconductor chip 22. When the power-supply plane 30 in the package substrate 21 has a sufficiently low resistance value compared with that of the power-supply wires 32, 33 and 34 in the semiconductor chip 22 as explained, the power-supply wires 32, 33 and 34 in the semiconductor chip 22 may be omitted and the same effects as those of the first embodiment are still available.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A semiconductor integrated circuit device comprising:
a semiconductor chip configured to have a power cut-off switch and a power cut-off region to which the supply of power may be cut off by said power cut-off switch, and
a substrate configured to have said semiconductor chip joined thereto;
wherein said power cut-off switch is located outside said power cut-off region, and
wherein said substrate has a substrate-side feed line, the substrate-side feed line being configured to transmit a power-supply voltage from inside said semiconductor chip to outside said semiconductor chip through said power cut-off switch and transmit the power-supply voltage back into said semiconductor chip to power said power cut-off region.

2. A semiconductor integrated circuit device according to claim 1, wherein said substrate-side feed line is configured to let either a high-potential power-supply voltage or a low-potential power-supply voltage transmitted out of said semiconductor chip through said power cut-off switch be transmitted back into said semiconductor chip.

3. A semiconductor integrated circuit device according to claim 2, wherein said semiconductor chip is joined to said substrate through bump electrodes installed in said semiconductor chip.

4. A semiconductor integrated circuit device according to claim 3,
wherein said semiconductor chip has power-supply wiring configured to transmit the power-supply voltage to said power cut-off region through said power cut-off switch, and
wherein said substrate-side feed line is coupled in parallel to said power-supply wiring.

5. A semiconductor integrated circuit device according to claim 4, wherein said substrate is configured to have a heat dissipation ball for dissipating heat of said substrate-side feed line.

6. A semiconductor integrated circuit device according to claim 5, further comprising a power-supply control circuit configured to cut off the supply of power to said power cut-off region by turning off said power cut-off switch when a circuit belonging to said power cut-off region is inactive.

* * * * *